US008187963B2

(12) United States Patent
Basol

(10) Patent No.: US 8,187,963 B2
(45) Date of Patent: May 29, 2012

(54) METHOD OF FORMING BACK CONTACT TO A CADMIUM TELLURIDE SOLAR CELL

(75) Inventor: Bulent M. Basol, Manhattan Beach, CA (US)

(73) Assignee: EncoreSolar, Inc., San Jose, CA (US)

( * ) Notice: Subject to any disclaimer, the term of this patent is extended or adjusted under 35 U.S.C. 154(b) by 134 days.

(21) Appl. No.: 12/880,671

(22) Filed: Sep. 13, 2010

(65) Prior Publication Data

US 2011/0284065 A1 Nov. 24, 2011

Related U.S. Application Data

(60) Provisional application No. 61/396,227, filed on May 24, 2010.

(51) Int. Cl.
*H01L 21/00* (2006.01)
*H01L 21/06* (2006.01)
*H01L 21/4763* (2006.01)
*H01L 21/3205* (2006.01)
*H01L 21/44* (2006.01)

(52) U.S. Cl. ............. 438/586; 438/84; 438/95; 438/98; 438/102; 438/597; 257/E21.475; 257/E21.485; 257/E31.015

(58) Field of Classification Search ........... 257/E21.485, 257/E21.476, E31.015
See application file for complete search history.

(56) References Cited

U.S. PATENT DOCUMENTS

| | | | |
|---|---|---|---|
| 4,456,630 A | 6/1984 | Basol | |
| 4,666,569 A | 5/1987 | Basol | |
| 4,734,381 A * | 3/1988 | Mitchell | 438/95 |
| 4,735,662 A | 4/1988 | Szabo et al. | |
| 5,472,910 A | 12/1995 | Johnson et al. | |
| 5,557,146 A | 9/1996 | Britt et al. | |
| 5,909,632 A | 6/1999 | Gessert | |
| 6,281,035 B1 * | 8/2001 | Gessert | 438/84 |
| 7,211,462 B2 * | 5/2007 | Romeo et al. | 438/95 |
| 2008/0251119 A1 * | 10/2008 | Forehand | 136/255 |
| 2010/0126580 A1 * | 5/2010 | Farrell et al. | 136/256 |

FOREIGN PATENT DOCUMENTS

WO WO-2011/149982 A2 12/2011

OTHER PUBLICATIONS

Basol, B.M. (May 21, 1990). "Thin Film CdTe Solar Cells—A Review," *IEEE* pp. 588-594.
Desai, D. et al. (Jan. 1, 2005). "Transparent ZnTe:Cu Contacts for Bifacial Characterization of CdTe Solar Cells," *MRS Proceedings* 865:F14.9.1-F14.9.6.
Feng, L. et al. (Apr. 27, 2007). "Studies of Key Technologies for Large Area CdTe Thin Film Solar Cells," *Thin Solid Films* 515(15):5792-5797.
International Search Report mailed Mar. 26, 2012, for PCT Patent Application No. PCT/US2011/037798, filed May 24, 2011, four pages.

* cited by examiner

*Primary Examiner* — Mohsen Ahmadi
(74) *Attorney, Agent, or Firm* — Morrison & Foerster LLP

(57) ABSTRACT

A method of forming an ohmic contact to a surface of a Cd and Te containing compound film as may be found, for example in a photovoltaic cell. The method comprises forming a Te-rich layer on the surface of the Cd and Te containing compound film; depositing an interface layer on the Te-rich layer; and laying down a contact layer on the interface layer. The interface layer is composed of a metallic form of Zn and Cu.

11 Claims, 2 Drawing Sheets

METHOD OF FORMING BACK CONTACT TO A CADMIUM TELLURIDE SOLAR CELL

CROSS-REFERENCE TO RELATED APPLICATIONS

This application claims priority under 35 U.S.C. 119(e) for U.S. Provisional Patent Application No. 61/396,227, filed May 24, 2010, the entire disclosure of which is incorporated herein by reference.

FIELD OF THE INVENTION

The present invention relates to methods for fabricating thin film IIB-VIA compound solar cells, more specifically CdTe solar cells.

BACKGROUND OF THE INVENTION

Solar cells and modules are photovoltaic (PV) devices that convert sunlight energy into electrical energy. The most common solar cell material is silicon (Si). However, lower cost PV cells may be fabricated using thin film growth techniques that can deposit solar-cell-quality polycrystalline compound absorber materials on large area substrates using low-cost methods.

Group IIB-VIA compound semiconductors comprising some of the Group IIB (Zn, Cd, Hg) and Group VIA (O, S, Se, Te, Po) materials of the periodic table are excellent absorber materials for thin film solar cell structures. Especially CdTe has proved to be a material that can be used in manufacturing high efficiency solar panels at a manufacturing cost of below $1/W.

FIG. 1 shows a commonly used structure of a CdTe based thin film solar cell. FIG. 1 shows a "super-strate" structure 10, wherein light enters the active layers of the device through a transparent sheet 11. The transparent sheet 11 serves as the support on which the active layers are deposited. In fabricating the "super-strate" structure 10, a transparent conductive layer (TCL) 12 is first deposited on the transparent sheet 11. Then a junction partner layer 13 is deposited over the TCL 12. A CdTe absorber film 14, which is a p-type semiconductor film, is next formed on the junction partner layer 13. Then an ohmic contact layer 15 is deposited on the CdTe absorber film 14, completing the solar cell. As shown by arrows 18 in FIG. 1, light enters this device through the transparent sheet 11. In the "super-strate" structure 10 of FIG. 1, the transparent sheet 11 may be glass or a material (e.g., a high temperature polymer such as polyimide) that has high optical transmission (such as higher than 80%) in the visible spectra of the sun light. The TCL 12 is usually a transparent conductive oxide (TCO) layer comprising any one of; tin-oxide, cadmium-tin-oxide, indium-tin-oxide, and zinc-oxide which are doped to increase their conductivity. Multi layers of these TCO materials as well as their alloys or mixtures may also be utilized in the TCL 12. The junction partner layer 13 is typically a CdS layer, but may alternately be compound layer such as a layer of CdZnS, ZnS, ZnSe, ZnSSe, CdZnSe, etc. The ohmic contact 15 is made of a highly conductive metal such as Mo, Ni, Cr, Ti, Al or a doped transparent conductive oxide such as the TCOs mentioned above. The rectifying junction, which is the heart of this device, is located near an interface 19 between the CdTe absorber film 14 and the junction partner layer 13.

Ohmic contacts to p-type CdTe are difficult to make because of the high electron affinity of the material. Various different approaches have been reported on the topic of making ohmic contacts to CdTe films. For example, U.S. Pat. No. 4,456,630 by B. Basol describes a method of forming ohmic contacts on a CdTe film comprising etching the film surface with an acidic solution, then etching with a strong basic solution and finally depositing a conductive metal. In U.S. Pat. No. 4,666,569 granted to B. Basol a multi layer ohmic contact is described where a 0.5-5 nm thick interlayer of copper is formed on the etched CdTe surface before a metallic contact is deposited. U.S. Pat. No. 4,735,662 also describes a contact using 1-5 nm thick copper, an isolation layer such as carbon, and an electrically conducting layer such as aluminum. U.S. Pat. No. 5,909,632 describes a method of improving contact to CdTe by depositing a first undoped layer of ZnTe, then depositing a doped ZnTe layer, such as metallic Cu as the dopant at concentrations of about 6 atomic percent, and finally depositing a metal layer. U.S. Pat. No. 5,472,910 forms an ohmic contact by depositing a viscous liquid layer containing a Group IB metal salt on the CdTe surface, heating the layer, removing the dried layer and depositing a contact on the surface. U.S. Pat. No. 5,557,146 describes a CdTe device structure with an ohmic contact comprising a graphite paste containing mercury telluride and copper telluride.

The present inventions provide improved ohmic contacts to CdTe films and facilitate the fabrication of ultra-thin devices.

SUMMARY OF THE PREFERRED EMBODIMENTS OF THE INVENTION

Embodiments of the invention are directed toward a method of making an improved ohmic contact for a solar cell and in particular for a CdTe solar cell. The method involves forming a Te-rich layer on the surface of a CdTe film which is the absorber of the solar or photo cell. Next, metallic forms of Zn and Cu are deposited on the Te-rich layer and then a contact layer is disposed on the Zn/Cu metallic forms.

Embodiments of the invention also are directed toward making an improved ohmic contact for a photovoltaic device such as a solar cell and to the resulting product. The solar cell has a transparent sheet, a transparent conductive layer disposed on the transparent sheet, a junction partner disposed on the transparent conductive oxide, a CdTe film disposed on the junction partner; a mixed interlayer of binary and/or ternary alloys comprising Cu, Te and Zn disposed on the CdTe film; and an ohmic contact formed on an upper surface of the mixed interlayer. The mixed interlayer comprises Zn in an atomic ratio with Cu of at least 90%.

More generally, embodiments of the invention are directed toward a method of forming an ohmic contact to a surface of a thin film p-type semiconductor compound formed of at least Cd and Te and optionally at least one of Mn, Mg and Zn. The method comprising forming a Te enriched layer on the surface of the p-type semiconductor compound; depositing an interface layer on the Te enriched layer; and laying down a contact layer on the interface layer, wherein, the interface layer comprises a metallic form of Cu and Zn.

DETAILED DESCRIPTION OF THE INVENTION

Figure 2:
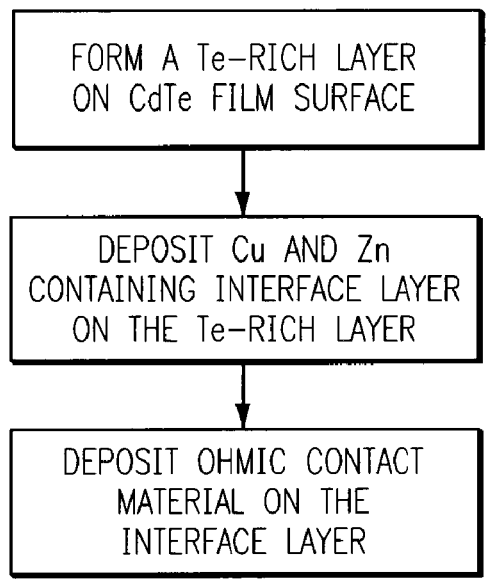
FIG. 2 shows the process flow for preferred embodiments of the present invention.

FIG. 2 shows the processing steps used to form an ohmic contact to a CdTe film in accordance with embodiments of the present invention. It should be noted that the method described herein is specifically suited for making ohmic contact to p-type CdTe material, which is commonly used in solar cell fabrication. As can be seen from FIG. 2, the first step of the process is to form a thin Te-rich layer on the surface of the CdTe film. The Te-rich layer can be obtained by various means, such as by depositing Te on the surface of the CdTe film using physical vapor deposition techniques (such as evaporation or sublimation and sputtering), by chemical vapor deposition (CVD) techniques or by chemically etching the surface of the CdTe film by an acidic etch solution. It is well known that acidic solutions, which may comprise at least one acid such as phosphoric acid, forming acid, sulfuric acid, bromine solution, chromic acid, nitric acid, etc., preferentially etch the Cd at the CdTe surface, leaving behind a Te-rich layer, i.e. a layer within which the Te/Cd molar ratio is larger than 1.0. The second step of the process involves deposition of an interface layer on the Te-rich layer, wherein the interface layer comprises Cu and Zn in their metallic form. The third step of the process involves deposition of an ohmic contact material on the interface layer.

Figure 3A:
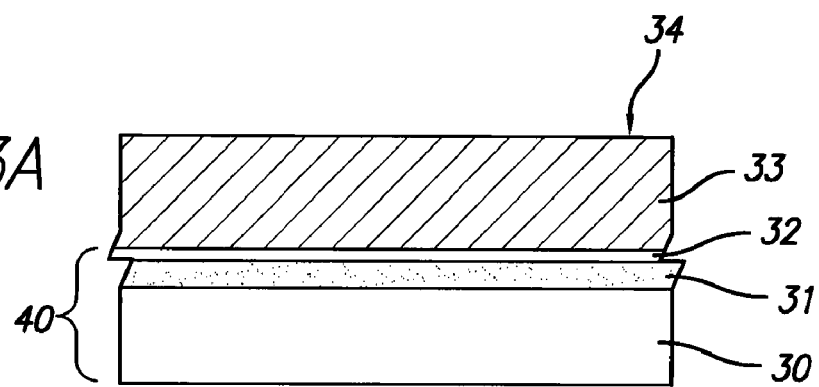
FIG. 3A shows a CdTe film deposited on a base.

FIGS. 3A, 3B, 3C and 3D show examples of the steps of the above described process, as it is applied to the fabrication of a solar cell. FIG. 3A depicts a stack comprising a transparent sheet 30, a transparent conductive layer such as a transparent conductive oxide layer 31, a junction partner layer 32 such as a CdS layer, and a CdTe film 33 which will be the absorber of the solar cell. The transparent sheet 30, the transparent conductive oxide layer 31 and the junction partner layer 32 together form a base 40. Once an ohmic contact layer is formed over the top surface 34 of the CdTe film 33, a solar cell would be obtained.

Figure 3B:
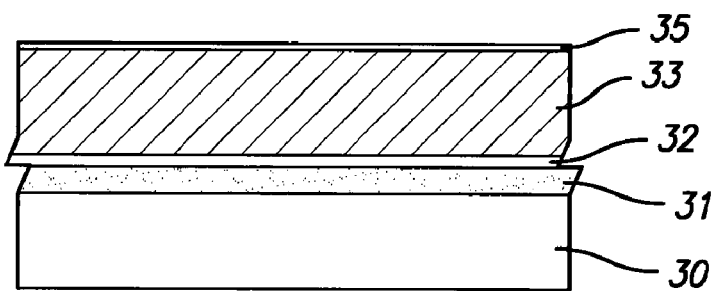
FIG. 3B shows a structure comprising a Te-rich layer on a surface of the CdTe film.

FIG. 3B shows a structure comprising a thin Te-rich layer 35 that is formed over the exposed surface of the CdTe film 33. As described before, the thin Te-rich layer 35 may be preferably formed by etching the exposed surface of the CdTe film 33 in an acidic solution. The thickness of the Te-rich layer 35 may be in the range of 5-200 nm, preferably in the range of 10-100 nm, and most preferably in the range of 20-50 nm.

Figure 3C:
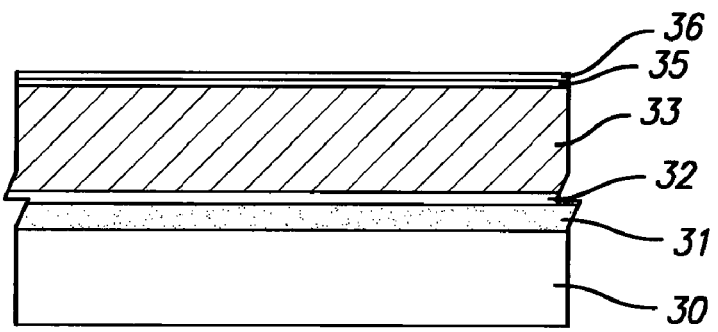
FIG. 3C shows an interface layer deposited on the Te-rich layer.

FIG. 3C shows an interface layer 36 formed on the Te-rich layer 35. The interface layer 36 comprises both Cu and Zn in their metallic form. The interface layer 36 may comprise a Cu/Zn stack or a Zn/Cu stack, or preferably, the interface layer 36 may comprise a metallic alloy of Cu—Zn. If the interface layer 36 is in the form of a Cu/Zn or Zn/Cu stack, the thickness of the Zn layer may be in the range of 2-50 nm, preferably in the range of 5-25 nm. The thickness of the Cu layer, on the other hand, may be in the range of 1-10 nm, preferably in the range of 2-5 nm. The stack may also comprise three or more layers of Cu and Zn, as for example, Cu/Zn/Cu or Zn/Cu/Zn/Cu. The thicknesses of the various layers of the stack are selected such that for the interface layer 36 as a whole, the atomic percent of Zn is preferably at least greater than 90% and more preferably in the range of 94-98% with the balance being Cu. Such atomic percentage should be taken into effect in selecting the total Cu and Zn thicknesses in the stack. The interface layer 36 may be deposited by various methods such as electrodeposition or physical vapor deposition, such as sputtering or evaporation. A preferred method for the deposition of the interface layer 36 is sputtering from a Cu—Zn alloy target.

Preferably, the interface layer 36 is a Cu—Zn metallic alloy with a thickness range of 2-50 nm, preferably a range of 5-30 nm, and most preferably in the range of 10-20 nm. The Cu—Zn metallic alloy has preferably a Zn content of at least 90 atomic percent (with the balance substantially being Cu). More preferably the metallic Cu—Zn alloy of the interface layer 36 has a Zn atomic percent in the range of 94-98% with the balance being substantially Cu.

The interface layer 36 consists essentially of only Cu and Zn in the amounts or ratios discussed above and does not contain other materials except as impurities or trace amounts.

Figure 1:
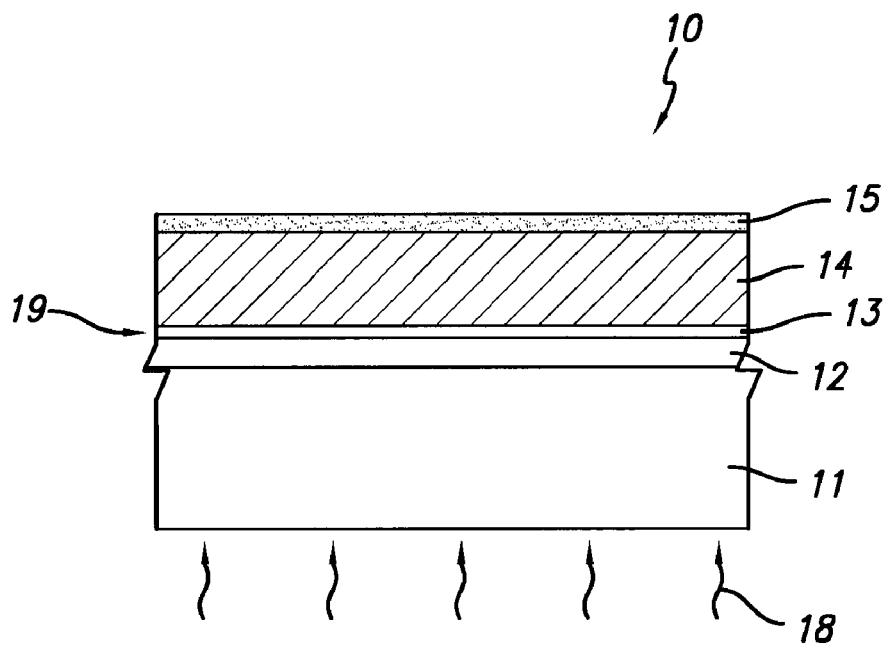
FIG. 1 is a cross-sectional view of a prior-art CdTe solar cell with a "super-strate structure".
Figure 3D:
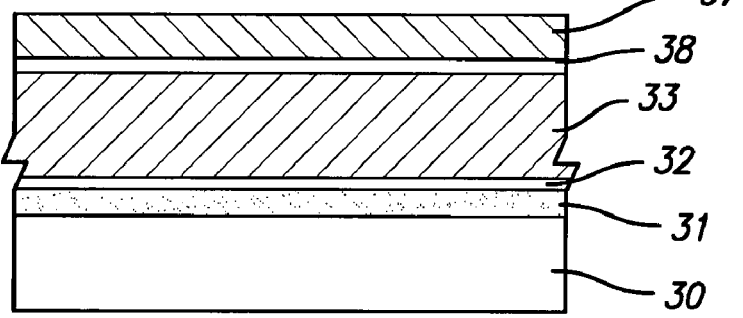
FIG. 3D is a cross sectional view of a CdTe solar cell structure formed in accordance with embodiments of the present invention.

FIG. 3D shows a finished device structure 39 obtained after a contact layer 37 is deposited. Contact layer 37 may be deposited by electrodeposition or physical vapor deposition techniques such as evaporation or sublimation and sputtering. Various materials such as Ni, Mo, Ta, Ti, Cr, Al, C, and their alloys or nitrides may be used in the contact layer 37. The contact layer may be a single layer of a material or it may comprise two or more layers of conductive materials such as those enumerated above. Moreover, two or more different materials selected from the group such as Ni, Mo, Ta, Ti, Cr, Al, C, and their alloys or nitrides may be used in the one or more layers constituting the contact layer 37. It should be noted that FIG. 3D does not show the Te-rich layer 35 and the interface layer 36 as two distinct layers, but instead depicts a mixed interlayer 38 between the CdTe film 33 and the contact layer 37. The reason for this is the fact that the Te-rich layer 35 and the interface layer 36 of FIG. 3C are relatively thin layers and they interact and may inter-diffuse during the step of depositing the contact layer 37. This interaction may form binary and ternary alloys comprising Cu, Te and Zn. It should also be noted that the finished device structure 39 may preferably be annealed at temperatures below 400° C., preferably in a temperature range of 150-350° C. to improve the electrical properties of the ohmic contact. During this annealing step, the Te-rich layer 35, and the interface layer 36 further intermix and react forming Zn—Cu—Te compounds that have low resistivity. Cu—Te alloys are low bandgap, low resistivity semiconductors. Zn—Te alloy is a large bandgap low resistivity semiconductor. The presence of these materials at the back contact provides a low contact resistance as well as a reflector for photogenerated electrons. As a result much thinner CdTe films, with thicknesses in the range of 0.5-1 microns (as opposed to 2-6 microns in the prior art of FIG. 1), may be fabricated using the contacting approach of the various embodiments of the present invention. Electron reflecting, low resistivity ohmic contact allows fabrication of cells with over 10% efficiency, even if the CdTe absorber layer thickness is less than 1 micron.

Benefits of using the Zn—Cu alloy interface layer of the present invention may be understood by comparing this to some of the other approaches. One method of making contact to a CdTe film is to sputter deposit a ZnTe layer on the CdTe surface as described in U.S. Pat. No. 5,909,632. This is then followed by deposition of a highly conductive contact layer such as C, Mo and Ni. This approach uses expensive ZnTe targets and slow RF sputtering approaches that cannot be controlled easily. The CdTe film also needs to be heated to over 300° C. during sputtering of the ZnTe film to be able to control the composition of the ZnTe film. The ZnTe film thickness in these approaches is at least 500 nm. Another contact forming method that was previously discussed involves deposition of a thin (1-5 nm) Cu layer on the CdTe surface followed by the deposition of a contact layer such as C, Mo and Ni. In this case controlling the thickness of the Cu layer, which is typically obtained by sputtering, is crucial. Too much Cu causes shorting, too little does not yield good ohmic contact. Therefore, control of this thickness in a manufacturing environment is difficult. Preferred embodiments of the present invention use a Te/Cu—Zn structure under the contact layer to form the ohmic contact. The Cu—Zn alloy layer may be obtained by sputtering using a Cu—Zn alloy target within which the Cu and Zn content is pre-determined and fixed. As a result, the composition of the interface layer deposited using this target is always the same from run-to-run in a production environment. Furthermore since the Cu amount in the Cu—Zn target is typically less than 10%, the thickness control limits for Cu—Zn alloy layers would not be as stringent as the thickness control limits necessary for pure Cu interface layers. This increases yield and simplifies the manufacturing process.

Embodiments of the invention have been described using CdTe as an example. Methods and structures described herein may also be used to form ohmic contacts to other compound films that may be described by the formula Cd(Mn,Mg,Zn)Te. The family of compounds described by Cd(Mn,Mg,Zn)Te includes materials which have Cd and Te and additionally at least one of Mn, Mg and Zn in their composition. It should be noted that adding Zn, Mn or Mg to CdTe increases its bandgap from 1.47 eV to a higher value.

Although the present invention is described with respect to certain preferred embodiments, modifications thereto will be apparent to those skilled in the art.

What is claimed is:

1. A method of forming an ohmic contact to a surface of a Cd and Te containing compound film comprising;
   forming a Te-rich layer on the surface of the Cd and Te containing compound film;
   depositing an interface layer on the Te-rich layer;
   laying down a contact layer on the interface layer, and annealing the interface layer;
   wherein, the step of depositing deposits the interface layer in the form of a stack comprising at least a layer of Zn and a layer of Cu or at least a layer of Cu and a layer of Zn.

2. The method in claim 1 wherein Cd and Te containing compound film is a CdTe film.

3. The method in claim 2 wherein the step of forming comprises etching the surface of the CdTe film in an acidic solution.

4. The method in claim 3 wherein the thickness of the interface layer is in the range of 5-30 nm.

5. The method of claim 4 wherein the Te rich layer has a thickness in the range of 10-100 nm.

6. The method of claim 1 wherein the interface layer comprises Zn in an atomic percentage of at least 90% with the balance being substantially Cu.

7. The method of claim 6 wherein the contact layer is selected from the group consisting of Ni, Mo, Ta, Ti, Cr, Al, C, and their alloys or nitrides.

8. The method in claim 1 wherein the step of annealing is carried out at a temperature range of 150-300° C.

9. The method in claim 1 wherein the Cd and Te containing compound film also comprises at least one of Mn, Mg and Zn.

10. A method of forming an ohmic contact to a surface of a p-type CdTe film of a photovoltaic device, the photovoltaic device having a substrate, a transparent conductive layer disposed on the substrate, a junction partner layer disposed on the transparent conductive layer, and the CdTe film disposed on the junction partner layer, the method comprising;
    forming a Te-rich layer on the surface of the CdTe film;
    depositing an interface layer on the Te-rich layer;
    laying down a contact layer on the interface layer, and annealing the interface layer;
    wherein, the interface layer comprises a metallic Cu—Zn alloy which comprises Zn in an atomic percentage of at least 90%.

11. The method in claim 10 wherein the step of annealing is carried out at a temperature range of 150-300° C.

* * * * *